(12) United States Patent
Smith et al.

(10) Patent No.: US 9,000,507 B2
(45) Date of Patent: Apr. 7, 2015

(54) METHOD AND SYSTEM FOR RECOVERING FROM TRANSISTOR AGING USING HEATING

(71) Applicants: Bradley P. Smith, Austin, TX (US); Mehul D. Shroff, Austin, TX (US)

(72) Inventors: Bradley P. Smith, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/929,013

(22) Filed: Jun. 27, 2013

(65) Prior Publication Data

US 2015/0002211 A1    Jan. 1, 2015

(51) Int. Cl.
*H01L 29/78* (2006.01)
*H01L 21/00* (2006.01)
*H01L 29/43* (2006.01)
*G05F 1/10* (2006.01)

(52) U.S. Cl.
CPC ............. *H01L 29/435* (2013.01); *G05F 1/10* (2013.01)

(58) Field of Classification Search
USPC ...................... 257/314, 405; 438/4
See application file for complete search history.

(56) References Cited

U.S. PATENT DOCUMENTS

| | | | | |
|---|---|---|---|---|
| 4,042,946 A | * | 8/1977 | Sokoloski | 257/253 |
| 7,457,180 B2 | * | 11/2008 | Harris | 365/207 |
| 8,344,475 B2 | * | 1/2013 | Shaeffer et al. | 257/528 |
| 2010/0025811 A1 | * | 2/2010 | Bronner et al. | 257/528 |
| 2012/0051166 A1 | | 3/2012 | Hsu et al. | |

OTHER PUBLICATIONS

Alam, M.A., et al., "A Comprehensive Model for PMOS NBTI degradation: Recent progress," Microelectronics Reliability 47, Jun. 2007, pp. 853-862.

* cited by examiner

*Primary Examiner* — Evan Pert
(74) *Attorney, Agent, or Firm* — Jonathan N. Geld

(57) ABSTRACT

A mechanism is provided for extending useable lifetimes of semiconductor devices that are subject to trapped charge carriers in a gate dielectric. Embodiments of the present invention provide heat to the gate dielectric region from one or more sources, where the heat sources are included in a package along with the semiconductor device. It has been determined that heat, when applied during a period when the channel region of a transistor is in accumulation mode or is not providing a current across the channel, can at least partially recover the device from trapped charge carrier effects. Embodiments of the present invention supply heat to the affected gate dielectric region using mechanisms available where the semiconductor device is used (e.g., in the field).

10 Claims, 7 Drawing Sheets

METHOD AND SYSTEM FOR RECOVERING FROM TRANSISTOR AGING USING HEATING

BACKGROUND

1. Field

This disclosure relates generally to semiconductor devices, and more specifically, to providing a method and system for recovering from transistor threshold voltage shifting due to transistor gate dielectric layer damage.

2. Related Art

Semiconductor devices, such as integrated circuits and printed circuit boards, perform a variety of functions to process data and interface with external components. These devices are often expected to perform functions in a variety of operational environments, operational voltages, and conditions over a prolonged period of time. For example, automotive engine controllers include semiconductor devices that need to operate in extremes of heat and cold over the lifetime of the automobile. As certain semiconductor devices age, they can experience shifts in their operational parameters.

One aging effect in certain transistors is bias temperature instability (BTI) that can result in charge carriers becoming trapped in the gate dielectric of the transistor when a high gate-to-source voltage is applied to the device. Another aging effect in certain transistors is hot-carrier injection (HCI) that can also cause charge carriers to become trapped in the gate dielectric of the transistor when a high drain-to-source voltage is applied in conjunction with a high gate-to-source voltage. As the number of charge carriers trapped in the dielectric layer increases, the operating threshold voltage of the transistor rises, and slows down the transistor over time, which may result in circuit performance failures.

In order to improve the lifetime performance of such devices and to extend those lifetimes, it is desirable to implement a mechanism for reducing the concentration of trapped charge carriers in a gate dielectric of semiconductor devices, while the devices are in their operating environment.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A mechanism is provided for extending useable lifetimes of semiconductor devices that are subject to trapped charge carriers in a gate dielectric. Embodiments of the present invention provide heat to the gate dielectric region from one or more sources, where the heat sources are included in a package along with the semiconductor device. It has been determined that heat, when applied during a period when the channel region of a transistor is in accumulation mode or is not providing a current across the channel, can at least partially recover the device from trapped charge carrier effects. Embodiments of the present invention supply heat to the affected gate dielectric region using mechanisms available where the semiconductor device is used (e.g., in the field). In one embodiment, a heater layer below the gate dielectric region is provided. In another embodiment, a heater layer above the gate is provided. In another embodiment, an external heater die is coupled to the semiconductor device die in a region close to the affected gate dielectric region. In a further embodiment, conductive vias can be provided to enhance heat flow to the affected region from the external heater die. In another embodiment, the gate metal, or a metal layer formed on the gate metal, can be used to directly heat the affected area.

Semiconductor devices are placed in operational environments in which those devices are expected to function for many years. Over that period of time, semiconductor devices such as transistors can often experience aging effects due to normal operational conditions. In addition, those operational environments can expose the devices to extremes of heat and cold, for example, which can accelerate aging damage to the semiconductor devices.

One aging effect in certain metal oxide semiconductor field effect transistors (MOSFETs) is bias temperature instability (BTI), which becomes a factor at high gate-to-source voltages ($V_{GS}$). A high $V_{GS}$ creates a high vertical electric field across the gate channel that leads to charge carriers (i.e., electrons or holes) from the transistor channel being pulled into the gate dielectric, which then traps the charge carriers. In high dielectric constant metal gates, the damage can be proportional to the length and width (i.e., area) of the channel. As the number of trapped charge carriers increases, the operating threshold voltage ($V_T$) of the transistor rises, and makes it more difficult to use the transistor. In digital circuit operation, BTI is more common during static operation of a transistor than in switching operation.

Figure 1:
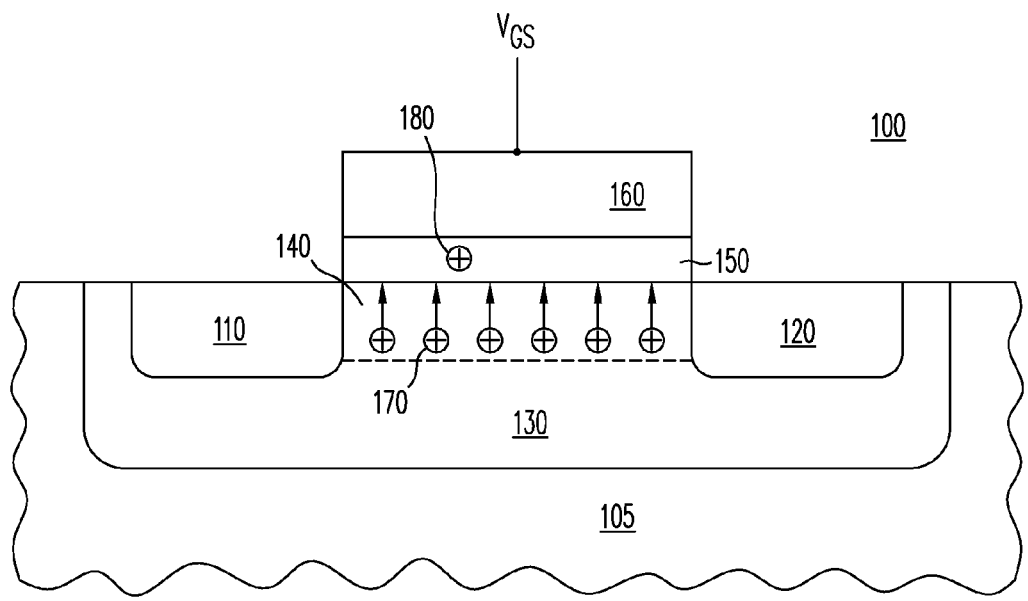
FIG. 1 is a simplified block diagram of a transistor cross section, illustrating bias temperature instability.

FIG. 1 is a simplified, cross-section block diagram illustrating BTI in a MOSFET 100 having p-type source and drain regions, 110 and 120, respectively, formed on a semiconductor substrate 105. An n-doped region (n-well 130) is formed beneath the source and drain regions in the substrate, and a portion of the n-well forms channel region 140. The source, drain, and n-well regions are formed using standard semiconductor fabrication techniques. Above the channel region is formed a gate dielectric layer 150 and a conductive gate layer 160. Again, the gate dielectric layer and conductive gate layer are formed using deposition techniques known in the art of semiconductor manufacture.

$V_{GS}$ refers to a voltage difference between metal gate layer 160 and source region 110. As $V_{GS}$ increases, the number of charge carriers 170 near the gate dielectric/channel layer interface of the channel layer 140 increases. At sufficiently high $V_{GS}$, one or more of the charge carriers are drawn into gate dielectric layer 150 and trapped (e.g., trapped charge carrier 180). One example of the source of these charge carriers is a weakening and breaking of silicon-hydrogen bonds at the interface between the silicon of the channel region and the gate dielectric layer under the influence of the high $V_{GS}$.

Another aging effect that can be experienced by MOSFETs is hot carrier injection (HCI), which can occur when the $V_{GS}$ is greater than the threshold voltage ($V_T$) in conjunction with a moderate to high drain-to-source voltage ($V_{DS}$) magnitude. The high electric field in the channel causes impact ionization of current carriers, some of which can become embedded in the gate dielectric. HCI damage is inversely proportional to channel length, and is more prevalent during switching than static operation in digital circuit operation.

Figure 2:
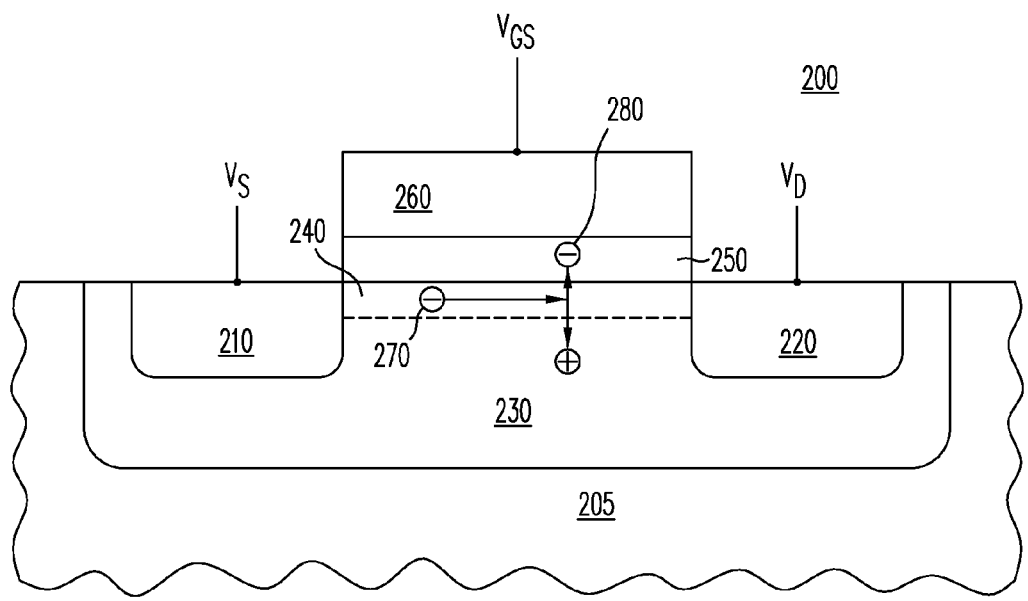
FIG. 2 is a simplified block diagram of a transistor cross section, illustrating hot-carrier injection.

FIG. 2 is a simplified, cross-section block diagram illustrating HCI in a MOSFET 200 having n-type source and drain regions, 210 and 220, respectively, formed on a semiconductor substrate 205. A p-type region (p-well 230) is formed beneath the source and drain regions in the semiconductor substrate, and a portion of the p-well forms channel region 240. Above the channel region is formed a gate dielectric layer 250 and a metal gate layer 260. The source, drain, p-well, gate dielectric layer, and metal gate layer are formed using techniques known in the art of semiconductor manufacture. As illustrated, during HCI, charge carriers in the channel (e.g., electron 270) provide a sufficient current that if a charge carrier impacts another charge carrier, impact ionization can result in a charge carrier being knocked into the gate dielectric layer and becoming trapped there (e.g., trapped electron 280)

Figure 3:
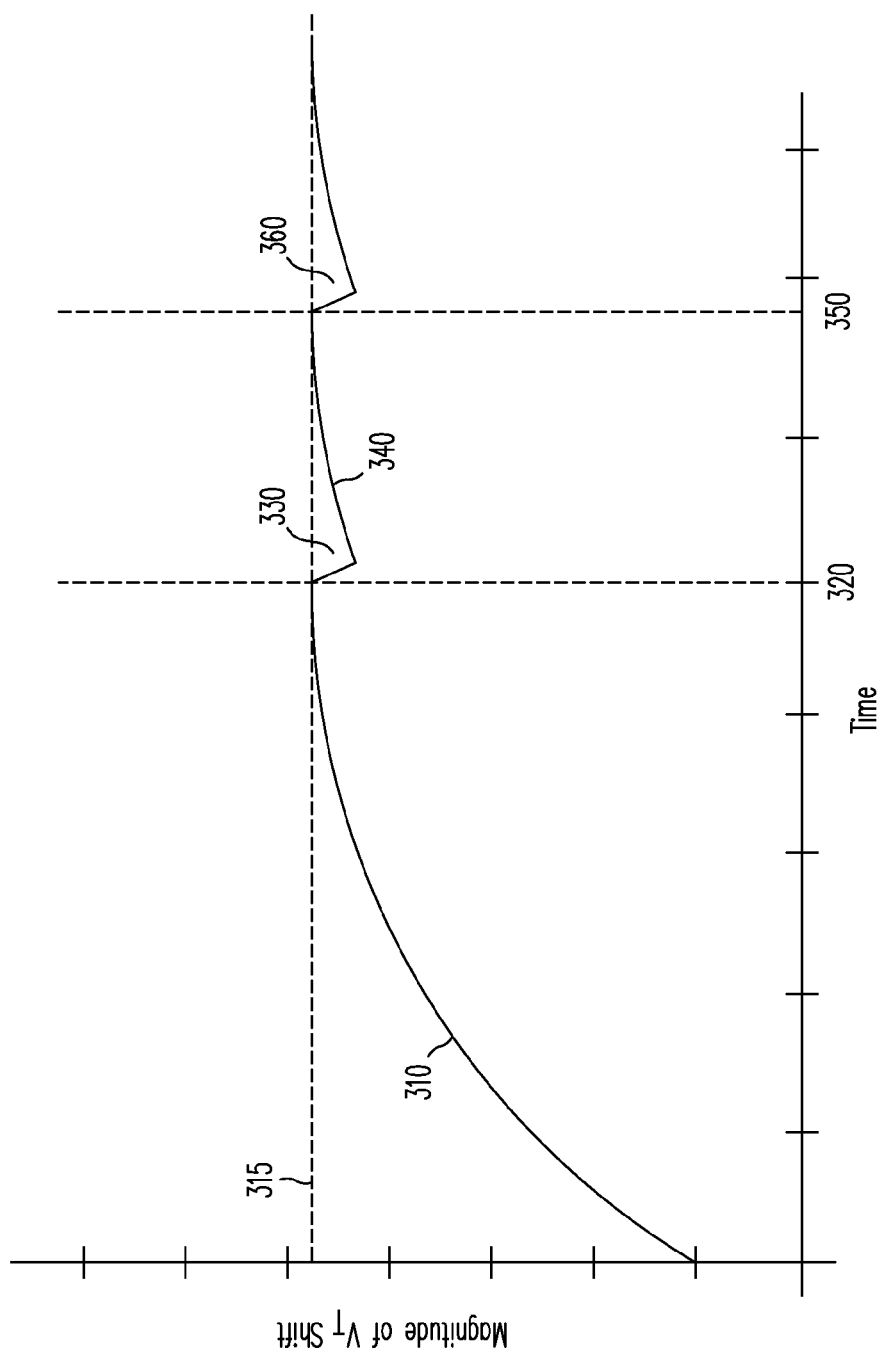
FIG. 3 is a simplified graph illustrating one example of BTI induced shifting of transistor threshold voltage $V_T$ over time.

FIG. 3 is a simplified graph illustrating one example of BTI induced shifting of MOSFET threshold voltage $V_T$ over time. During an initial operational time period 310, there is an increase in threshold voltage, approaching a desired maximum threshold value 315. Maximum threshold value 315 is selected to be at or below the design parameters for the device. Over time, buildup of charge carriers in the gate dielectric can increase the threshold voltage beyond the design parameters of the device.

It has been shown that if a device having such built up charge carriers in the gate dielectric is subjected to a period of heating 330 (beginning at time 320), without any charge being applied to the gate or during an accumulation mode of the transistor, the effects of BTI induced shifting can be reduced or healed. After a sufficient period of time, $V_T$ shift effects can be reduced to a level equivalent to a much earlier period in the device's operational life, effectively eliminating some of the aging effect for use during a post-heating period 340. In order to maintain a normal operational $V_T$ level, the transistor can be subjected to repeated heating cycles to heal BTI induced shifting of the threshold voltage (e.g., heating period 360 starting at time 350). Embodiments of the present invention provide mechanisms for applying appropriate levels of heat to the areas affected by charge carrier trapping due to aging mechanisms such as BTI and HCI.

FIG. 3 illustrates a technique in which the heating is applied when the VT shift has risen to a selected maximum threshold value 315. In other techniques for controlling VT shift, heating can be applied independently of a maximum threshold value shift and may be triggered depending upon the type of device and the application within which that device operates. For example, heating can be applied whenever the circuit can be turned off and put into a recovery mode, as determined by the application in which the circuit is used, and which can take place before or after the maximum threshold value illustrated in FIG. 3. For example, in an automotive application, recovery can be performed at night when the automobile in which the device is installed is parked.

Figure 4:
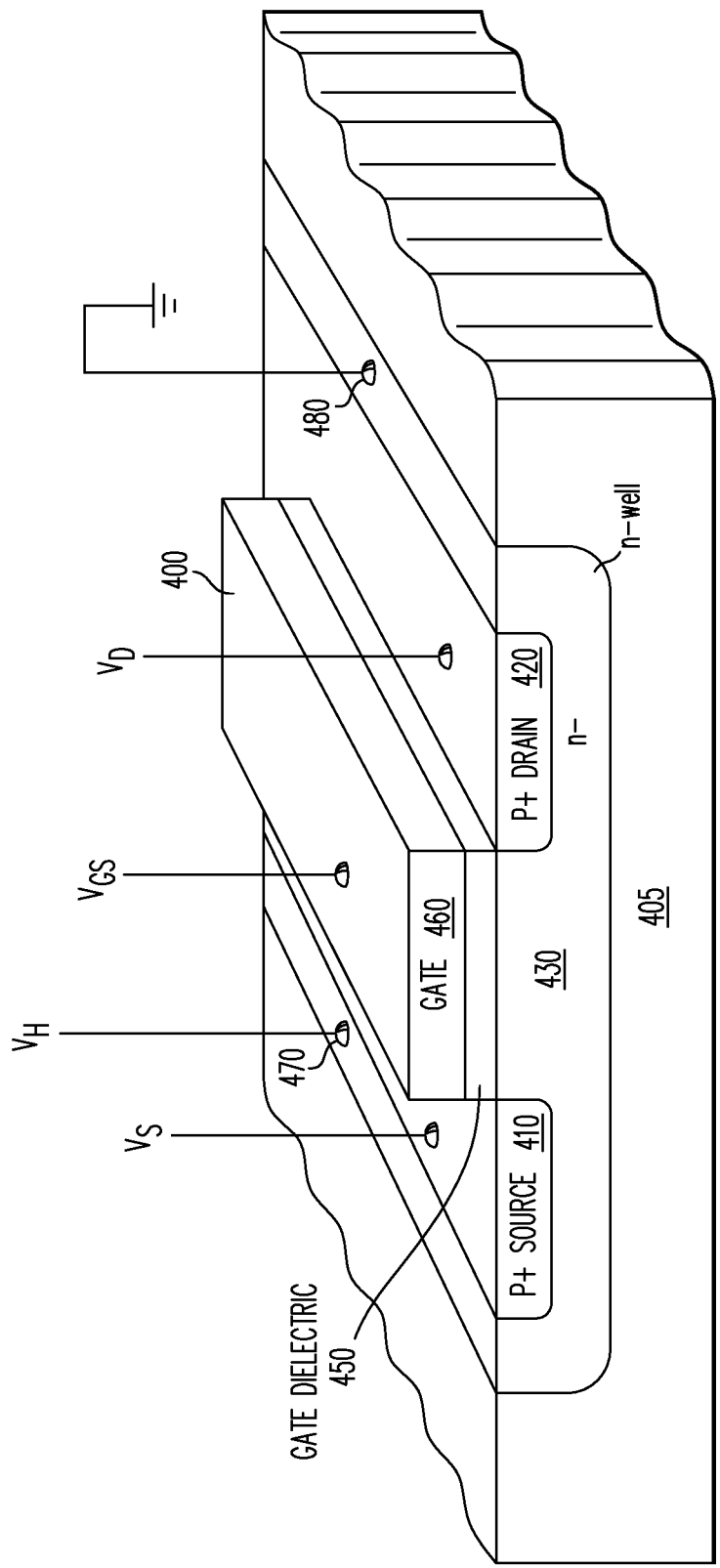
FIG. 4 is a simplified cross-section block diagram illustrating use of a device n-well as a heater to alleviate $V_T$ shifting due to trapped charge carriers in a gate dielectric layer, in accordance with one embodiment of the present invention.

FIG. 4 is a simplified, cross-section block diagram illustrating use of a device n-well as a heater to alleviate $V_T$ shifting due to trapped charge carriers in a gate dielectric layer, in accordance with one embodiment of the present invention. A transistor 400 is formed on a substrate 405 that includes a source region 410, a drain region 420, and an n-well region 430. Formed over the channel region is a gate dielectric layer 450 and a conductive gate 460. As discussed above, the source, drain, n-well, gate dielectric and gate regions are all formed using standard techniques known in the art of semiconductor fabrication. In alternate embodiments, as would be understood by a person of skill in the art, an n-channel MOSFET can be formed in an isolated p-well.

In some cases, substrate 405 is a semiconductor material. In particular, substrate 405 may, in some embodiments, be a bulk substrate wafer of a semiconductor material. In other embodiments, substrate 405 may include multiple layers, at least one of which includes a semiconductor material. For example, substrate 405 may, in some cases, include a dielectric layer. In such embodiments, the dielectric layer may be of the same material or a different material than gate dielectric layer 450 described below. A semiconductor material may generally refer to a material in which one or more non-dopant elements are selected from Group IV of the periodic table or, alternatively, may refer to a material in which a plurality of synthesized non-dopant elements are selected from Groups II through VI of the periodic table. Examples of Group IV semiconductor materials which may be suitable for substrate 405 include silicon, germanium, mixed silicon and germanium ("silicon-germanium"), mixed silicon and carbon ("silicon-carbon"), mixed silicon, germanium and carbon ("silicon-germanium-carbon"), and the like. Examples of Group II-V materials suitable for wafer substrate 405 include gallium arsenide, aluminum gallium arsenide, indium gallium arsenide, and the like.

In general, gate dielectric layer 450 includes a dielectric material, such as silicon dioxide, silicon nitride, silicon oxynitride, aluminum oxide, lanthanum oxide, hafnium oxide, or any combination of such layers to provide electrical isolation between wafer substrate 405 and conductive gate 460 subsequently formed upon gate dielectric layer 450. In some cases, gate dielectric layer 450 may be thermally grown from wafer substrate 405. In other embodiments, gate dielectric layer 450 may be deposited. In either case, an exemplary range of thickness for gate dielectric layer 450 can generally be between approximately 10 angstroms and approximately 300 angstroms. Larger or smaller thicknesses for gate dielectric layer 450, however, may be employed depending on the design specifications of the ensuing devices.

Conductive gate 460 can include a material such as amorphous silicon, polysilicon, a nitride, a metal-containing material, another suitable material, and the like, or any combination thereof. In one embodiment, the material of conductive gate 460 can include platinum, palladium, iridium, osmium, ruthenium, rhenium, indium-tin, indium-zinc, aluminum-tin, cobalt, nickel, titanium, or any combination thereof. The layer forming conductive gate 460 can have a thickness of between approximately 30 and approximately 200 nm and can be grown or deposited using a conventional or proprietary technique, such as a chemical vapor deposition (CVD) technique, a physical vapor deposition (PVD) technique, the like, or any combination thereof.

N-well 430 is formed such that contacts 470 and 480 are in electrical contact with n-well 430 in order that a current can be provided through the n-well. As illustrated, a heating voltage, $V_H$, can be applied to contact 470 while contact 480 is connected to ground, thereby creating a heating current through n-well 430.

Heating voltage $V_H$ is selected such that, in combination with resistance provided by n-well 430, an appropriate amount of heat is supplied to the gate dielectric region to reduce damage attributable to the trapped charge carriers. If needed, n-well 430 can be formed with additional n+ structures (not shown) to modify the resistance of the n-well region, so as to enable creation of a desired heat with the amount of available voltage. One advantage of using the n-well as the heating source is that no additional processing is performed in order to form the heating source (unless additional structures are formed in the n-well). An advantage of using n-well 430 for heat generation is that the n-well is in close proximity to the damaged gate dielectric layer, and therefore a lower level of heat can be applied to the damaged dielectric layer without fear of dissipation. On the other hand, a larger region than just the damaged area is subjected to heat, which may require result in a larger use of power.

In a typical semiconductor device, a single n-well can be provided for many transistors built on and above the n-well (e.g., a so-called "sea of gates"). In such a case, applying current to the single n-well can generate heat to alleviate trapped charge carrier damage to each transistor built on and above the n-well. Alternatively, additional structures such as the above-mentioned n+ structures can be formed in the n-well to provide heat to specific regions within the n-well, rather than heating the entire n-well. Such targeted heating can have an advantage of reducing an amount of power needed to heat the damaged dielectric layer regions of a semiconductor device. It should also be noted that $V_H$ is not limited to the operating voltages of the semiconductor device (e.g., $V_{GS}$, $V_S$, and $V_D$). Thus, there is flexibility in how such n-well heating can be implemented. For example, since the recovery effects of heating are typically realized when the semiconductor device is in either accumulation mode or is off, depending on the amount of voltage available for heating and time for heating, long heating periods at low voltages may be performed or short heating periods at higher voltages may be performed.

Figure 5:
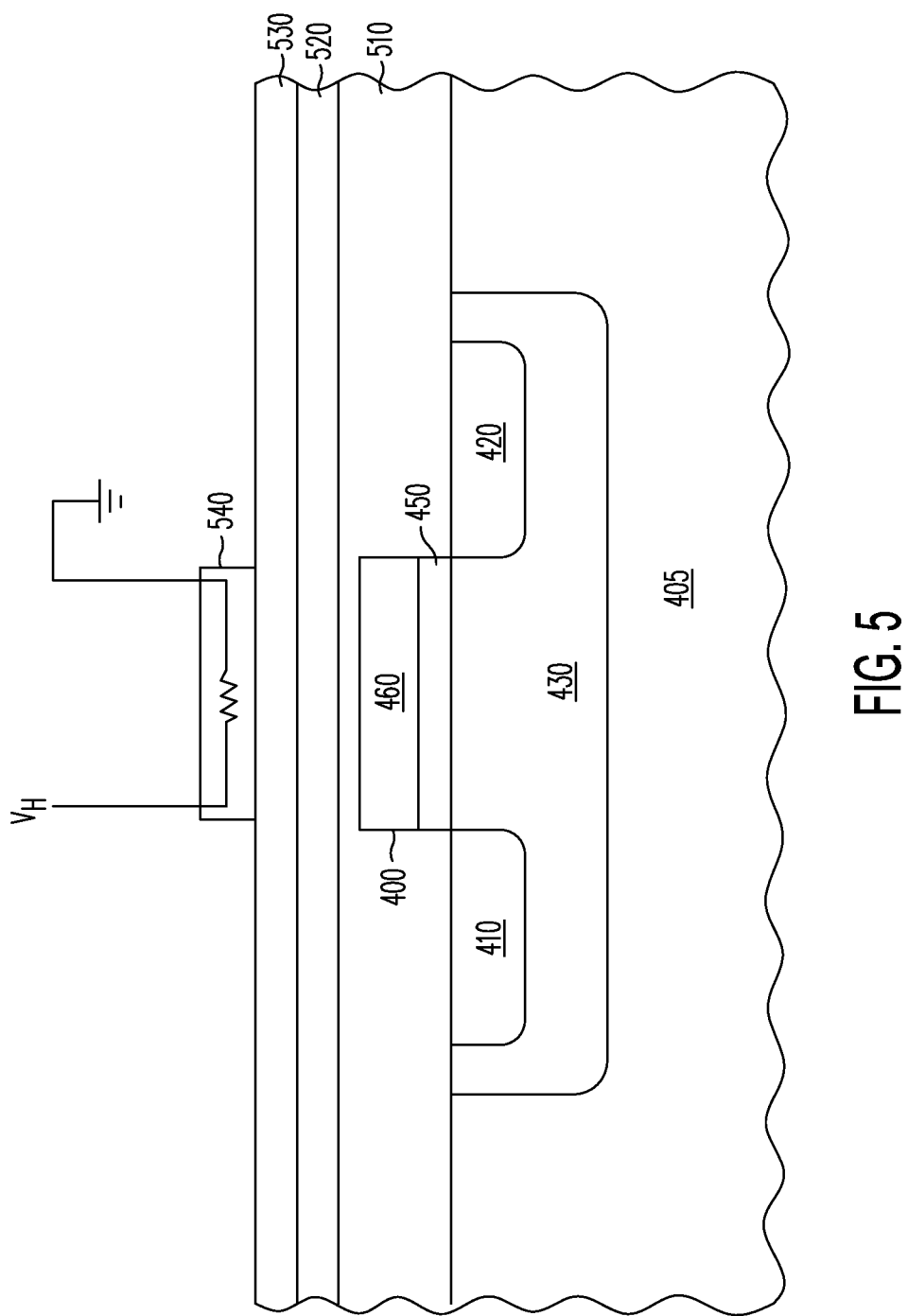
FIG. 5 is a simplified cross-section block diagram illustrating a heater region in a layer above the semiconductor device for alleviating $V_T$ shifting due to trapped charge carriers in a gate dielectric layer, in accordance with one embodiment of the present invention.

FIG. 5 is a simplified cross-section block diagram illustrating a heater region in a layer above the semiconductor device for alleviating $V_T$ shifting due to trapped charge carriers in a gate dielectric layer, in accordance with one embodiment of the present invention. As with FIG. 4, transistor 400 is formed on substrate 405, which includes a source region 410, a drain region 420, and an n-well region 430. Formed over the channel region as a gate dielectric layer 450 and a conductive gate 460. A dielectric layer 510, and one or more conductive and dielectric layers 520 and 530, can be formed over the transistor region as appropriate to the application. A conductive resistive layer 540 can be formed and patterned according to methods known in the art of semiconductor manufacturing.

Patterning of conductive resistive layer 540 can be performed such that conductive resistive regions are positioned above the gate stacks of transistors (e.g. gate dielectric layer 450 and conductive gate 460). Conductive resistive layer 540 can be formed of a variety of resistive metals (e.g., tungsten, aluminum, silicided metal, copper, and the like), selected in accordance with the application. In addition, conductive resistive layer 540 may be formed by various processing techniques, including, but not limited to, damascene processing and blanket deposition followed by pattern etching.

To heat a damaged gate dielectric layer 450, a heating voltage $V_H$ is applied through metalized resistive region 540. Heat is transferred from conductive resistive region 540 through the intervening layers 510, 520, and 530, as well as through conductive gate 460 to reach gate dielectric layer 450. One advantage of heating the gate dielectric in this manner is that particular transistors can be targeted more easily than with the n-well heating approach, thereby saving power used for heating. This comes at a cost, however, of additional processing steps in forming and patterning conductive resistive layer 540.

Figure 6:
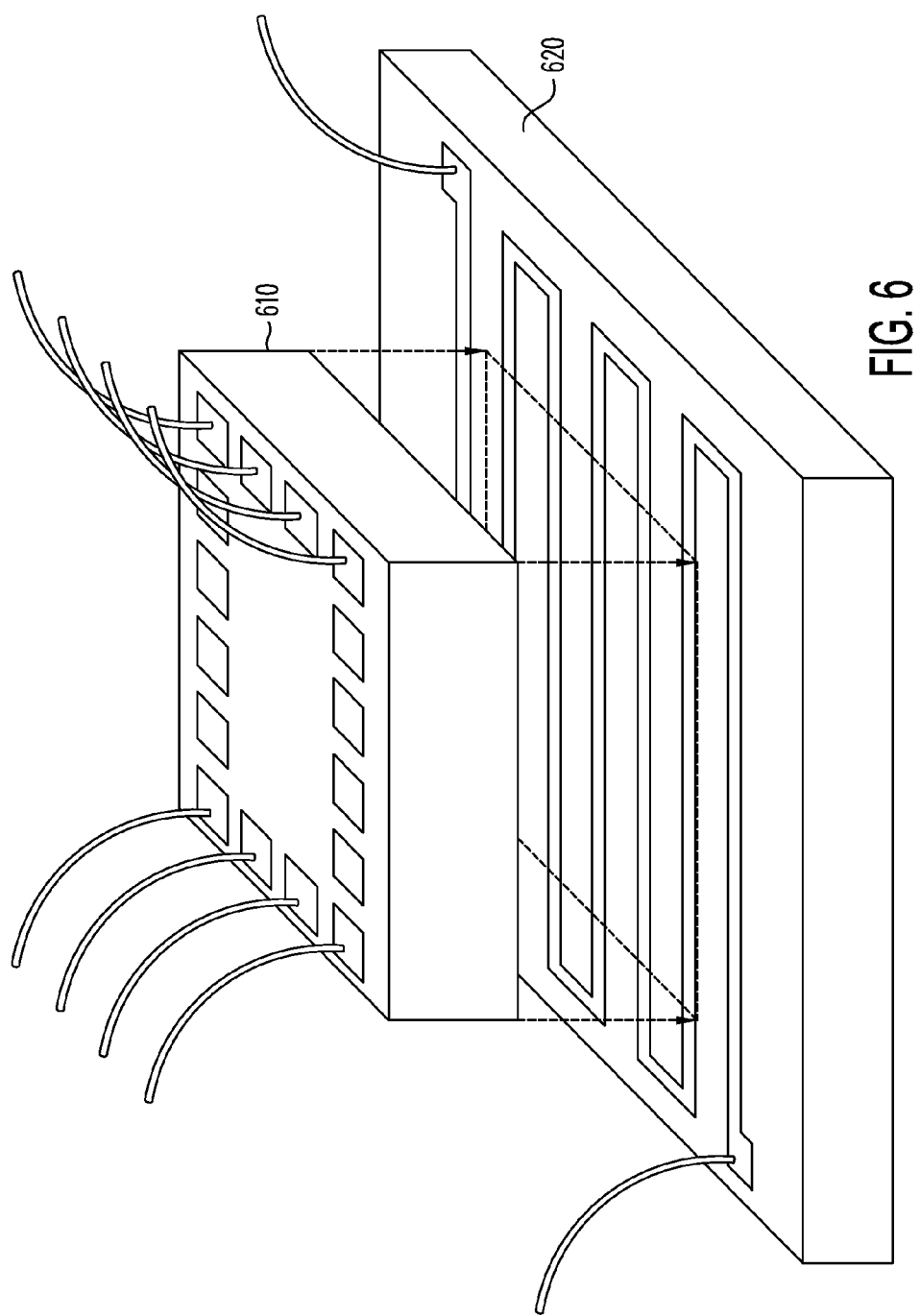
FIG. 6 is a simplified cross-section block diagram illustrating a heater die provided for attaching to a semiconductor device die in a package, in accordance with one embodiment of the present invention.

FIG. 6 is a simplified block diagram illustrating a heater die provided for attaching to a semiconductor device die in a package, in accordance with one embodiment of the present invention. A semiconductor device die 610 that incorporates one or more transistors subject to charge carrier trapping from mechanisms such as BTI or HCI is attached to a heater die 620. The heater die is constructed to include a resistive coil heater or a large resistor that can generate heat. Heating using an external heating die, such as heater die 620, is distributed across semiconductor device die 610 and not targeted at any particular area on the semiconductor device die. Such an embodiment may be used for applications that are subject to gate dielectric damage due to charge carrier trapping in multiple areas of the semiconductor device die. Another advantage of this application of heating is that no heating voltage needs to be routed through the active semiconductor device die 610, but instead can be kept entirely external to the semiconductor device die.

Heater die 620 can include a heating coil formed from a metal deposition or polysilicon, for example. For metal heating coils, an alternating current may be more effective in quickly achieving a desired temperature from the heater die than an equivalent direct current. This is because a DC current may need to be limited for an effective heating.

For each embodiment discussed herein, it should be noted that it has been determined that the hotter the temperature applied to a semiconductor device having trapped charge carriers, the faster the recovery experienced by the device. Time available for heating of semiconductor devices may be dependent upon the application, since in order to benefit from heating, the transistors must be off or in accumulation mode. Thus, the logic of the application will determine the heating time. For example, automotive applications may have a significant time available for heating to achieve recovery because the car incorporating the device will be shut down for significant periods (e.g., overnight). Thus, lower temperatures over long periods of time can be used. On the other hand, devices such as cell phones may have significantly reduced periods in which the transistors are not used, and therefore higher temperatures over a shorter time period would be indicated. As another example, a multi-core processor can perform recovery heating of specific cores when those cores are not being used, but once heating recovery has begun the core should remain inactive.

Figure 7:
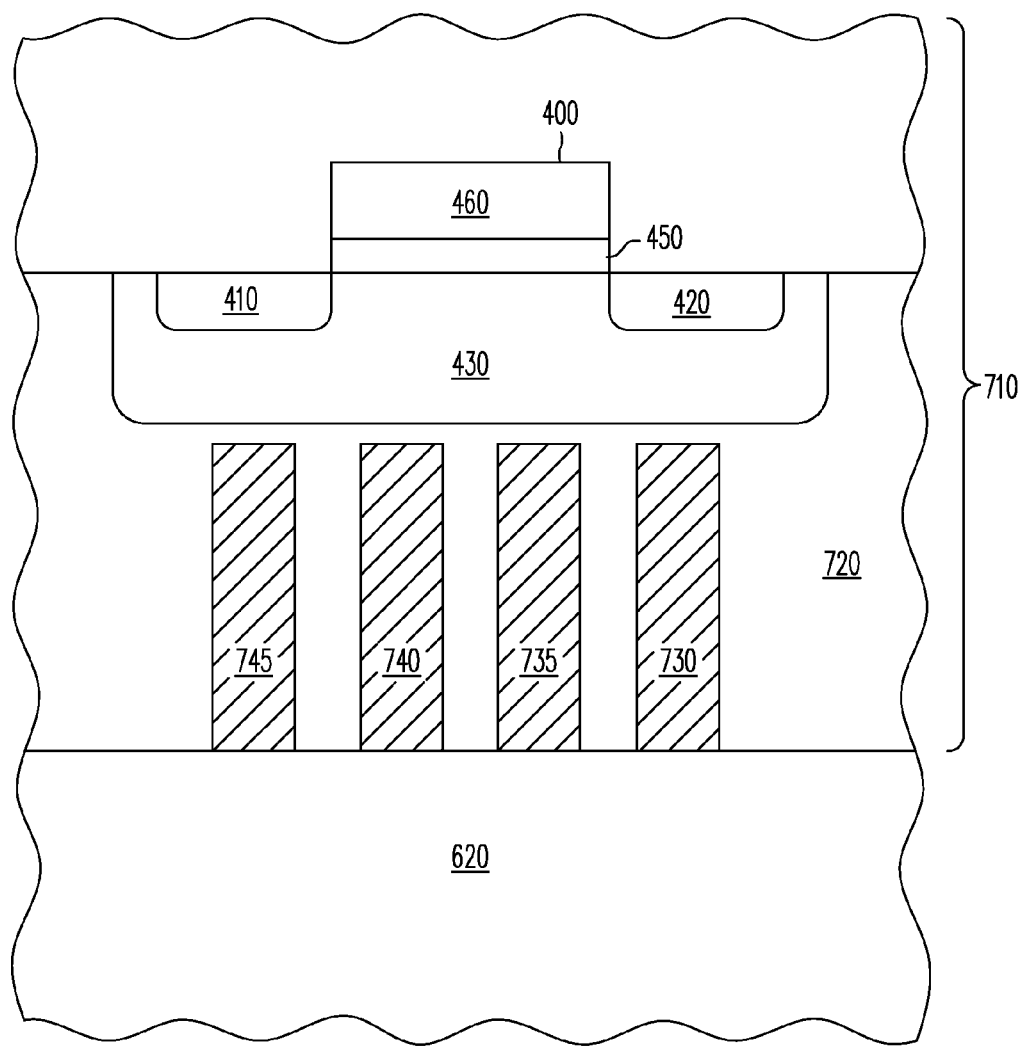
FIG. 7 is a simplified cross-section block diagram of a cross section of a semiconductor device die incorporating through-silicon vias to conduct heat provided by a source external to the device die to specific points within the semiconductor device die, in accordance with an embodiment of the present invention.

FIG. 7 is a simplified block diagram of a cross section of a semiconductor device die incorporating through-silicon vias to conduct heat provided by a source external to the device die to specific points within the semiconductor device die, in accordance with an embodiment of the present invention. The embodiment illustrated in FIG. 7 can be used in conjunction with the external heater die configuration illustrated in FIG. 6. The semiconductor device die 610 includes one or more MOSFET devices 400 on silicon substrate 720. MOSFET device 400 is constructed as discussed above with regard to previous embodiments. That is, as with FIG. 4, transistor 400 is formed on substrate 720, which includes a source region 410, a drain region 420, and an n-well region 430. Formed over the channel region are a gate dielectric layer 450 and a conductive gate 460.

One or more through-silicon vias are formed from a major surface of semiconductor device die 710 configured to be in proximity to heat source 620, or an alternative heating source configured to contact semiconductor device die 710. As illustrated, through-silicon vias 730, 735, 740, and 745 are formed through silicon substrate 720 to a region at or near the MOSFET gate dielectric. These vias can be formed using techniques known in the art of semiconductor fabrication (e.g., etching, mechanical drilling, laser drilling, laser ablation, and the like). Once the holes are formed they can be filled with a thermally conductive metal, such as copper, tungsten, and the like, using a process such as electroplating.

Used in conjunction with heater die 620, through silicon vias can target the heat generated by the heater die. This provides benefits of both targeted heating to the affected gate dielectrics, while at the same time providing additional benefits of an external heating source (e.g., not routing power for the heater in the device die). One negative of the through silicon vias is additional processing required to drill and fill the via holes.

Figure 8:
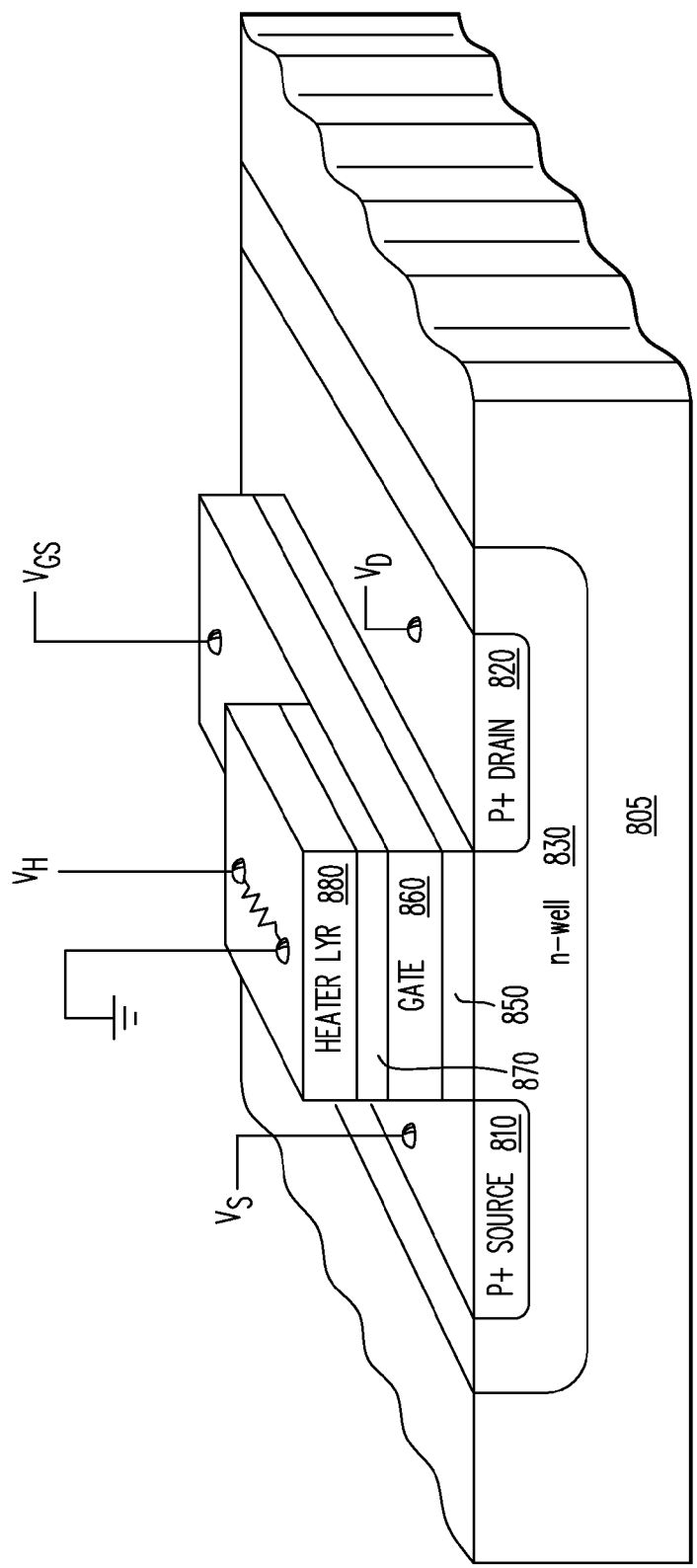
FIG. 8 is a simplified cross-section block diagram illustrating a transistor gate heater for use in alleviating $V_T$ shifting due to trapped charge carriers in a gate dielectric layer of the transistor gate, in accordance with one embodiment of the present invention.

FIG. 8 is a simplified cross-section block diagram illustrating a transistor gate heater layer 880 for use in alleviating $V_T$ shifting due to trapped charge carriers in a gate dielectric layer of the transistor gate, in accordance with one embodiment of the present invention. Similar to those discussed above, a transistor is formed on substrate 805 that includes a source region 810, a drain region 820, and an n-well region 830. Formed over the channel region is a gate dielectric layer 850 and a conductive gate 860. As discussed above, the source, drain, n-well, gate dielectric and gate regions are all formed using standard techniques known in the art of semiconductor fabrication.

On conductive gate 860 is formed one or more dielectric layers 870 to electrically isolate conductive gate 860 from a subsequently formed heater layer 880. Heater layer 880 and dielectric layer 870 are patterned to lie on top of the gate stack formed by at least dielectric layer 850 and conductive gate 860. Heater layer 880 is a resistive metal region to which a heating voltage $V_H$ can be applied to generate heat that conducts through the conductive gate to the damaged gate dielectric layer.

One advantage of the embodiment in FIG. 8 over the embodiment in FIG. 5 is that the heater layer is in much closer proximity to gate dielectric layer 850. Thus, less heat needs to be generated in order to conduct a desired level of heat to the gate dielectric. As a consequence, less heating voltage/current needs to be provided. In addition, the heating can be very targeted to the regions needing heat for repairs. One negative of this mechanism for applying heat is the additional processing required to form the heater layer, including deposition and patterning. An additional negative is the requirement to route the $V_H$ to the appropriate areas of the semiconductor device. In an alternative embodiment, to avoid additional processing to form the heater layer, the gate conductive layer itself (e.g., conductive gate 860) can be used as the heater layer. In this case, separate contacts to supply $V_H$ to the gate conductive layer are also routed. Due to the nature of the gate conductive layer, a limited heating voltage can be applied. For applications allowing for longer heating times at lower temperatures, this may be a solution. Applications requiring heating on only very specific device regions of the semiconductor device will benefit most from these types of heating mechanisms.

Embodiments of the present invention provide a variety of mechanisms to take advantage of ability to heat to correct $V_T$ shift due to trapped charge carriers in gate dielectric regions of semiconductor devices. These mechanisms can be either incorporated into a semiconductor device package, either in the semiconductor device die itself or external to the device die but within a package including both the active heat source and the device. In this manner, recovery of trapped charge carrier damage due to causes such as BTI and HCI can be performed in field-installed semiconductor devices, thereby extending the life of those devices.

By now it should be appreciated that there has been provided a semiconductor device package that includes a semiconductor device die having a semiconductor device subject to a shift in threshold voltage due to trapped charge carriers in a gate dielectric layer of the semiconductor device and a heating device located within the semiconductor device package and configured to selectively provide heat to the gate dielectric layer of the semiconductor device. The heat is sufficient to decrease the shift in threshold voltage due to trapped charge carriers in the gate dielectric layer of the semiconductor device.

In one aspect of the above embodiment, selectively providing heat to the gate dielectric layer includes applying heat when the semiconductor device is in one or more of accumulation mode or having zero current between source and drain of the semiconductor device.

In another aspect, the semiconductor device die includes the heating device. In one further aspect, the heating device includes an n-well of the semiconductor device configured in thermal contact with the gate dielectric layer, and two or more electrical contacts to the n-well configured to provide an electrical current through the n-well. A resistance of the n-well provides the heat to the gate dielectric layer in response to the electrical current. In still a further aspect, the semiconductor device die further includes a plurality of semiconductor device each subject to a rising shift in threshold voltage due to trapped charge carriers in corresponding gate dielectric layers of the plurality of semiconductor devices. The corresponding gate dielectric layers are formed in thermal contact with the n-well. Providing the electrical current to the n-well generates heat sufficient to decrease a magnitude of the shift in threshold voltage due to trapped charge carriers in the corresponding gate dielectric layers of each of the plurality of semiconductor devices.

In another aspect of the aspect in which the semiconductor device die includes the heating device, the heating device includes a gate stack of the semiconductor device where the gate stack includes the gate dielectric layer and a resistive layer, and two or more electrical contacts to the resistive layer configured to provide an electrical current through the resistive layer. A resistance of the resistive layer provides the heat to the gate dielectric layer in response to the electrical current. In a further aspect, the resistive layer includes a conductive gate layer formed over the gate dielectric layer and the two or more electrical contacts to the resistive layer do not include an electrical contact configured to provide a gate-to-source voltage for the semiconductor device. In another further aspect, the gate stack includes the gate dielectric layer, a conductive gate formed over the gate dielectric layer, and the resistive layer formed over the conductive gate layer. A heater dielectric layer electrically isolates the resistive layer from the conductive gate layer.

In another aspect of the aspect in which the semiconductor device die includes the heating device, the heating device includes a resistive layer formed over a gate stack of the semiconductor device where the gate stack includes the gate dielectric layer and a conductive gate layer, and two or more electrical contacts to the resistive layer configured to provide an electrical current through the resistive layer. A resistance of the resistive layer provides the heat to the gate dielectric layer in response to the electrical current.

In another aspect of the above embodiment, the heating device includes a heating device die thermally coupled to a major surface of the semiconductor device die. In a further aspect, the heating device die includes a heating resistor configured to provide the heat in response to an electrical current passed through the heating resistor. In another further aspect, the semiconductor device package further includes one or more thermally conductive conduits having a first end at or near the major surface of the semiconductor device die and a second end at or near the gate dielectric layer. The thermally conductive conduits are configured to transmit the heat generated by the heating device die to the gate dielectric layer.

In another embodiment of the present invention, a method is provided for decreasing a magnitude of a threshold voltage shift of a semiconductor device packaged in a semiconductor device package. The method includes placing the semiconductor device in one of accumulation mode or having zero current between source and drain, and heating a gate dielectric layer of the semiconductor device to a temperature sufficient to decrease the magnitude of the threshold voltage shift. The heating is performed using a heating device located within the semiconductor device package.

One aspect of the above embodiment further includes performing the heating for a time sufficient to realize a predetermined decrease in threshold voltage. In another aspect, the shift in threshold voltage is due to trapped charge carriers in the gate dielectric layer. Another aspect further includes determining when to place the semiconductor device in accumulation mode or zero current mode, where that determining is performed in light of operational parameters of the semiconductor device.

Another embodiment of the present invention provides for an apparatus that includes: a semiconductor device package having a semiconductor device die with a semiconductor device subject to a shift in threshold voltage due to trapped charge carriers in a gate dielectric layer of the semiconductor device, and a heating device located within the semiconductor device package and configured to selectively provide heat to the gate dielectric layer of the semiconductor device; a first power source configured to supply voltage and current sufficient to operate logic of the semiconductor device die; and, a second power supply configured to supply voltage and current sufficient to operate the heating device. The heat is sufficient to decrease a magnitude of the shift in threshold voltage due to trapped charge carriers in the gate dielectric layer of the semiconductor device. The voltage and current sufficient to operate the heating device are not equal to the voltage and current sufficient to operate the logic of the semiconductor device.

In one aspect of the above embodiment, selectively providing heat to the gate dielectric layer includes applying heat when the semiconductor device is in one or more of accumulation mode or having zero current between source and drain of the semiconductor device. In another aspect of the above embodiment, the semiconductor device die includes the heating device. In still another aspect of the above embodiment, the heating device includes a heating device die coupled to a major surface of the semiconductor device die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a semiconductor device die comprising a semiconductor device subject to a shift in threshold voltage due to trapped charge carriers in a gate dielectric layer of the semiconductor device;
   a heating device located within the semiconductor device package and configured to selectively provide heat to the gate dielectric layer of the semiconductor device, wherein
      the heat is sufficient to decrease the shift in threshold voltage due to trapped charge carriers in the gate dielectric layer of the semiconductor device;
   an n-well of the semiconductor device configured in thermal contact with the gate dielectric layer; and
   two or more electrical contacts to the n-well configured to provide an electrical current through the n-well, wherein a resistance of the n-well provides the heat to the gate dielectric layer in response to the electrical current.

2. The semiconductor device package of claim 1 wherein said selectively providing heat to the gate dielectric layer comprises applying heat when the semiconductor device is in one or more of accumulation mode or having zero current between source and drain of the semiconductor device.

3. The semiconductor device package of claim 1 wherein the semiconductor device die comprises the heating device.

4. The semiconductor device package of claim 1 wherein the semiconductor device die further comprises:
  a plurality of semiconductor devices each subject to a rising shift in threshold voltage due to trapped charge carriers in corresponding gate dielectric layers of the plurality of semiconductor devices, wherein
    the corresponding gate dielectric layers are formed in thermal contact with the n-well, and
    said providing the electrical current to the n-well generates heat sufficient to decrease a magnitude of the shift in threshold voltage due to trapped charge carriers in the corresponding gate dielectric layers of each of the plurality of semiconductor devices.

5. A semiconductor device package comprising:
  a semiconductor device die comprising a semiconductor device subject to a shift in threshold voltage due to trapped charge carriers in a gate dielectric layer of the semiconductor device;
  a heating device located within the semiconductor device package and configured to selectively provide heat to the gate dielectric layer of the semiconductor device, wherein
    the heat is sufficient to decrease the shift in threshold voltage due to trapped charge carriers in the gate dielectric layer of the semiconductor device, and
    the semiconductor device die comprises the heating device;
  a gate stack of the semiconductor device, wherein the gate stack comprises
    the gate dielectric layer and a resistive layer,
    a conductive gate layer formed over the gate dielectric layer, and
    the resistive layer formed over the conductive gate layer, wherein a heater dielectric layer electrically isolates the resistive layer from the conductive gate layer,
  two or more electrical contacts to the resistive layer configured to provide an electrical current through the resistive layer, wherein
    a resistance of the resistive layer provides the heat to the gate dielectric layer in response to the electrical current.

6. A semiconductor device package comprising:
  a semiconductor device die comprising a semiconductor device subject to a shift in threshold voltage due to trapped charge carriers in a gate dielectric layer of the semiconductor device; and
  a heating device located within the semiconductor device package and configured to selectively provide heat to the gate dielectric layer of the semiconductor device, wherein
    the heat is sufficient to decrease the shift in threshold voltage due to trapped charge carriers in the gate dielectric layer of the semiconductor device, and
    the heating device comprises a heating device die thermally coupled to a major surface of the semiconductor device die.

7. The semiconductor device package of claim 6, wherein the heating device die comprises a heating resistor configured to provide the heat in response to an electrical current passed through the heating resistor.

8. The semiconductor device package of claim 6 wherein the semiconductor device package further comprises:
  one or more thermally conductive conduits having a first end at or near the major surface of the semiconductor device die and a second end at or near the gate dielectric layer, wherein the thermally conductive conduits are configured to transmit the heat generated by the heating device die to the gate dielectric layer.

9. An apparatus comprising:
  a semiconductor device package comprising
    a semiconductor device die comprising a semiconductor device subject to a shift in threshold voltage due to trapped charge carriers in a gate dielectric layer of the semiconductor device, and
    a heating device located within the semiconductor device package and configured to selectively provide heat to the gate dielectric layer of the semiconductor device, wherein
      the heating device comprises a heating device die thermally coupled to a major surface of the semiconductor device die, and
      the heat is sufficient to decrease a magnitude of the shift in threshold voltage due to trapped charge carriers in the gate dielectric layer of the semiconductor device;
  a first power source configured to supply voltage and current sufficient to operate logic of the semiconductor device die; and
  a second power source configured to supply voltage and current sufficient to operate the heating device, wherein the voltage and current sufficient to operate the heating device are not equal to the voltage and current sufficient to operate the logic of the semiconductor device.

10. The apparatus of claim 9 wherein said selectively providing heat to the gate dielectric layer comprises applying heat when the semiconductor device is in one or more of accumulation mode or having zero current between source and drain of the semiconductor device.

* * * * *